United States Patent
Baumstark (10) Patent No.: US 10,768,251 B2
(45) Date of Patent: Sep. 8, 2020

(54) METHOD FOR ANALYZING AN NMR SPECTRUM OF A LIPOPROTEIN-CONTAINING SAMPLE

(71) Applicant: numares AG, Regensburg (DE)

(72) Inventor: Daniela Baumstark, Alteglofsheim (DE)

(73) Assignee: numares AG, Regensburg (DE)

( * ) Notice: Subject to any disclaimer, the term of this patent is extended or adjusted under 35 U.S.C. 154(b) by 0 days.

(21) Appl. No.: 16/341,994

(22) PCT Filed: Dec. 12, 2017

(86) PCT No.: PCT/EP2017/082410
§ 371 (c)(1),
(2) Date: Apr. 15, 2019

(87) PCT Pub. No.: WO2018/108898
PCT Pub. Date: Jun. 21, 2018

(65) Prior Publication Data
US 2019/0250229 A1      Aug. 15, 2019

(30) Foreign Application Priority Data
Dec. 12, 2016 (DE) .................. 10 2016 224 691

(51) Int. Cl.
*G01V 3/00* (2006.01)
*G01R 33/465* (2006.01)
(Continued)

(52) U.S. Cl.
CPC ........... *G01R 33/465* (2013.01); *G01N 24/08* (2013.01); *G01R 33/4625* (2013.01)

(58) Field of Classification Search
USPC ....................................................... 324/309
See application file for complete search history.

(56) References Cited

U.S. PATENT DOCUMENTS

| 4,933,844 A | 6/1990 | Otvos |
| 2004/0142496 A1* | 7/2004 | Nicholson .......... G01R 33/4625 |
| | | 436/536 |

(Continued)

FOREIGN PATENT DOCUMENTS

| DE | 68916729 T2 | 12/1994 |
| DE | 102004026903 A1 | 12/2005 |
| WO | 2015079000 A1 | 6/2015 |

OTHER PUBLICATIONS

Baumstark et al., "NMR spectroscopy—a modern analytical tool for serum analytics of lipoproteins and metabolites", J Lab Med, 2015, 11 pages.

(Continued)

*Primary Examiner* — Rodney E Fuller
(74) *Attorney, Agent, or Firm* — The Webb Law Firm (57) ABSTRACT

Disclosed is a method for analyzing an NMR spectrum of a lipoprotein-containing sample. The method includes the following steps: a) defining a spectral range to be analyzed of at least 0.5 ppm of an NMR spectrum of a lipoprotein-containing sample; b) fitting a first spectral function of a first individual lipid component and at least one further spectral function of a further individual lipid component into the whole spectral range to be analyzed; and c) determining a concentration or an amount of the first individual lipid component and the further individual lipid component and therefrom a concentration or an amount of the first defined lipoprotein class or lipoprotein subclass in the lipoprotein-containing sample and optionally of each other defined lipoprotein class or lipoprotein subclass based on the fitting operations of step b).

12 Claims, 4 Drawing Sheets

(51) Int. Cl.
*G01N 24/08* (2006.01)
*G01R 33/46* (2006.01)

(56) References Cited

U.S. PATENT DOCUMENTS

| | | |
|---|---|---|
| 2008/0038829 A1 | 2/2008 | Kremer et al. |
| 2010/0253934 A1* | 10/2010 | D'Ascenzi ............. G01N 21/33 356/51 |
| 2013/0325353 A1* | 12/2013 | Otvos .................. G01N 24/088 702/19 |
| 2016/0077116 A1* | 3/2016 | Otvos ..................... G01N 33/92 506/12 |
| 2017/0160215 A1 | 6/2017 | Mallol Parera et al. |
| 2018/0020947 A1* | 1/2018 | Cistola ................... A61B 5/055 600/411 |

OTHER PUBLICATIONS

Mallol et al., "Human serum/plasma lipoprotein analysis by NMR: Application to the study of diabetic dyslipidemia", Progress in Nuclear Magnetic Resonance Spectroscopy, 2013, pp. 1-24, vol. 70.

\* cited by examiner

METHOD FOR ANALYZING AN NMR SPECTRUM OF A LIPOPROTEIN-CONTAINING SAMPLE

CROSS-REFERENCE TO RELATED APPLICATIONS

This application is the United States national phase of International Application No. PCT/EP2017/082410 filed Dec. 12, 2017, and claims priority to German Patent Application No. 10 2016 224 691.7 filed Dec. 12, 2016, the disclosure of each of which is hereby incorporated by reference in its entirety.

BACKGROUND OF THE INVENTION

Field of the Invention

The disclosure relates to a method for analyzing an NMR spectrum of a lipoprotein-containing sample.

Description of Related Art

In methods for analyzing NMR spectra known from prior art, often individual fit functions comprising a single line or a low number of individual lines combined to a hill fitted into an NMR spectrum of the sample are used in order to assign concentrations of individual constituents of the sample to the measured NMR spectrum. For reducing the complexity of those fitting functions, often only specific spectral regions, such as the $CH_2$ or the $CH_3$ region are fitted.

If the concentrations of lipoprotein classes or lipoprotein subclasses are to be determined, corresponding reference spectra or reference models (reference values) have to be provided. A prerequisite of this is to create defined reference lipoprotein classes or reference lipoprotein subclasses by physically separating the classes or subclasses in a sample and subsequently quantitatively analyzing the lipoprotein particles of these reference classes or reference subclasses. Due to an inherent inaccuracy of such separation techniques, the reference classes or reference subclasses and therewith the reference values are inaccurate, too.

If certain fit algorithms are to be applied to a measured NMR spectrum, it is necessary to deconvolve the NMR spectrum in the best possible way to separate individual signals or lines from each other. In addition, the fit functions to be applied have to be defined such that the specific lipoprotein classes or lipoprotein subclasses are reflected.

In analyzing methods known from prior art which are directed to determine the concentration of a certain lipoprotein class or lipoprotein subclass, the fit functions are chosen such that they represent a particle size, independent on its concrete particle composition. To give an example, functions of NMR spectra have been used that have been separated on the basis of measured lipoprotein (sub)fractions that have been previously obtained by ultracentrifugation of a sample. In prior art techniques, bell-shaped curves have been used to simulate such spectra of individual lipoprotein (sub)fractions. Nonetheless, in both cases the constant composition of the individual lipoprotein (sub)fractions is mandatory.

As already mentioned, only very narrow spectral ranges have been analyzed in prior art techniques to reduce the complexity of the fitting functions. It has turned out that signals of high intensity, such as the signals attributed to $CH_3$ and $CH_2$ groups have only a very low overlapping so that they have been preferred for fitting operations. However, these signals require very complex deconvolution since they occur in all lipids and therewith in all lipoprotein classes and lipoprotein subclasses.

SUMMARY OF THE INVENTION

It is an object underlying the proposed solution to provide a novel method for analyzing an NMR spectrum that is more reliable than the methods known from prior art and that is suited to determine the concentration or the amount of individual lipoprotein classes or lipoprotein subclasses in the measured sample.

This object is achieved by a method having features as described herein. This method for analyzing an NMR spectrum of a lipoprotein-containing sample comprises the steps explained in the following.

First, the spectral range to be analyzed is defined. The spectral range extends over a chemical shift of at least 0.5 ppm of an NMR spectrum of the lipoprotein-containing sample.

Then, a first spectral function of a first individual lipid component and at least one further spectral function of a further individual lipid component is fitted into the whole spectral range to be analyzed. In contrast to prior art methods, not only an individual signal (lying, e.g., in the $CH_2$ or the $CH_3$ region), but a broader spectral range is fitted by the first spectral function. Thereby, this first spectral function does not represent an NMR spectrum of a lipoprotein particle or of lipoprotein particles of a defined lipoprotein class or lipoprotein subclass, but rather represents at least a part of an NMR spectrum of an individual lipid component of a lipoprotein. In the same way the further spectral function represents an individual lipid component of a lipoprotein. That means that a much smaller chemical entity, namely a lipid instead of a lipoprotein, is used to perform the fitting operation. The first spectral function does not only represent at least a part of the NMR spectrum of the first individual lipid component, but also takes into account the behavior of the first lipid component in the surroundings (or environment) of a lipoprotein particle. The same applies for the at least one further spectral function. Thereby, this lipoprotein particle belongs to a first defined lipoprotein class or a first defined lipoprotein subclass.

The term "at least a part of an NMR spectrum" does, in an embodiment, not encompass the possibility that the function only relates to a single NMR line but always represents at least two NMR lines, in particular a plurality of NMR lines, in the considered spectral range.

Different spectral functions of different lipids in the same lipoprotein particle are considered since lipoproteins are not composed of a single individual lipid component, but of a number of different lipid components.

In an embodiment, the respective function represents the whole NMR spectrum of the respective lipid component.

If all spectral functions relating to the individual lipid components of the first defined lipoprotein class or lipoprotein subclass have been fitted into the NMR spectrum of the lipoprotein-containing sample, a concentration of the individual lipid components and therefrom a concentration of the lipoprotein particles of this first defined lipoprotein class or lipoprotein subclass can be assigned to the measured sample.

Finally, a concentration or an amount of the first defined lipoprotein class or lipoprotein subclass and optionally also of each other defined lipoprotein class or lipoprotein subclass is determined based on the precedingly explained fitting operations.

One difference between this novel method for analyzing an NMR spectrum and analyzing methods known from prior art is that fit functions relating to individual lipid components rather than fit functions relating to lipoprotein classes or lipoprotein subclasses are used. In addition, a broader spectral range is fitted at a time, thus significantly enhancing the reliability and the robustness of the applied fit. Inaccuracies based on ill-conditioned spectral deconvolution and ill-conditioned line separation, and fit operations based on individual spectral lines as well as inaccuracies based on insufficient physical separation of individual lipoprotein (sub)fractions for generating suited reference values are fully overcome by the instantly claimed method Furthermore, the obtained result is not modelled with respect to references but is based on calibration functions and is thus to be considered as more "direct" result.

In a broader aspect, the solution is based on the idea that all constituents of the sample measured by NMR spectroscopy can be defined by individual spectral functions of such NMR spectra of the individual components making up the constituents. These components can be, e.g., proteins, lipids and metabolites in different concentrations and ratios. Thereby, the solution focuses on the analysis of lipoprotein concentration in the sample.

The inventor has found out that the NMR signals of proteins which are located within lipoproteins (so-called apolipoproteins) can be neglected since apolipoproteins are either not tightly bound to a lipoprotein particle and can such be assigned to proteins in solution (such as serum proteins in case of a blood serum sample) or are such tightly bound to lipoprotein particles that their mobility and therewith the resulting NMR signal is relatively small. Consequently, the NMR signals of the lipid components are fully sufficient in order to determine the concentration of a specific lipoprotein class or lipoprotein subclass in a sample.

In an embodiment, the precedingly explained fitting step can also be performed for fit functions relating to individual lipid components of other defined lipoprotein classes or lipoprotein subclasses. In doing so, the fitting is done with spectral functions of individual lipid components, wherein each spectral function represents an NMR spectrum or at least a part of an NMR spectrum of an individual lipid component. Thereby, the behavior of this lipid component in the surroundings of a lipoprotein particle of another defined lipoprotein class or lipoprotein subclass is taken into account. It is possible to omit certain NMR signals of an NMR spectrum in the function for describing the respective NMR spectrum. In doing so, it is possible to perform the according fitting procedure without accounting for certain spectral features that can possibly not be assigned to a specific lipid component but could have a non-unique origin.

While the fitting operations can be performed in a timely staggered (consecutive) manner, they are performed, in an embodiment, at the same time. Thereby, a fit of the first spectral function is influenced by a fit of a second spectral function and vice versa.

As explained above, a calibration of functions leads to concentration of lipids of a specific lipoprotein class or lipoprotein subclass. Afterwards, a concentration or an amount of this other defined lipoprotein class or lipoprotein subclass is therefrom calculated in an embodiment.

In an embodiment, the spectral range to be analyzed extends over at least 0.6 ppm, in particular at least 0.7 ppm, in particular at least 0.8 ppm, in particular at least 0.9 ppm, in particular at least 1 ppm, in particular at least 1.5 ppm, in particular at least 2 ppm, in particular at least 2.5 ppm, in particular at least 3 ppm, in particular at least 3.5 ppm, in particular at least 4 ppm, in particular at least 5 ppm, in particular at least 6 ppm, in particular at least 7 ppm, in particular at least 8 ppm, in particular at least 9 ppm and very particular at least 10 ppm. In addition, any suited range that can be built-up from the before-mentioned lower thresholds for the spectral range is also suited for defining the spectral range to be analyzed. To give an example, a spectral range of 3 ppm to 10 ppm, in particular 4 ppm to 9 ppm etc. can be used for defining the spectral range to be analyzed.

In an embodiment, the spectral range to be analyzed encompasses the whole measured spectral range in which NMR signals are observed. Thus, if the NMR spectrum of the analyzed sample exhibits NMR signals in a spectral range of 0 ppm to 10 ppm, then the spectral range to be analyzed also encompasses the spectral range of 0 ppm to 10 ppm. In such a case, it would be 10 ppm broad. In doing so, a very robust fit of the NMR spectrum by the spectral function of the individual lipid components can be achieved, leading to reliable results for subsequent calculation of the concentration or amount of the respective lipoprotein class or lipoprotein subclass on the basis of the concentration or amount of the respective lipid component.

In an embodiment, the lipoprotein-containing sample is a body fluid sample. In a particularly suited embodiment, the lipoprotein-containing sample is a blood serum sample (also simply referred to as serum sample). In blood serum, all solved proteins can be well described as a combination of different albumin and globulin functions. Furthermore, an NMR spectrum of lipoprotein deficient serum (LPDS) very well describes the serum protein components in blood serum. A blood plasma sample or a urine sample in particular if blood is present in urine can also be used as lipoprotein-containing sample.

In an embodiment, an NMR spectrum of compounds other than lipoproteins or lipids is subtracted from the NMR spectrum of the lipoprotein-containing sample before the above-mentioned fitting operations are performed. Instead of a "real" NMR spectrum, the function of such NMR spectrum can equally well be used for an according subtraction operation. Subtracting influences of compounds other than lipoproteins or lipids makes subsequent fitting operations easier and enhances the accuracy of an according fitting procedure. To give an example, NMR signals of proteins and/or sugars can be subtracted from the NMR spectrum of the sample to be analyzed.

In an embodiment, the NMR spectrum to be subtracted is an NMR spectrum of lipoprotein deficient serum (LPDS). This embodiment is suited if the sample which is analyzed by NMR spectroscopy is a blood serum sample. In such a case, all influences by solved proteins are subtracted from the NMR spectrum of the blood serum sample so that only signals resulting from lipoproteins remain present in the NMR spectrum. Signals resulting from metabolites such as amino acids or sugars can be subtracted like background signals or can be suppressed. To give an example, signals of quick diffusing metabolites can be efficiently suppressed in NMR spectroscopy by applying diffusion-ordered spectroscopy to the respective sample. Alternatively or additionally, another protein-depending spectrum can be used to be subtracted from the NMR spectrum of the lipoprotein-containing sample in order to compensate for protein-dependent signals.

All lipoproteins are generally built-up from the same lipid components. These lipid components building up lipoproteins are cholesterol, cholesterol esters, triglycerides, phospholipids like phosphatidylcholine, phosphatidylserine, phosphatidylethanolamine and/or phosphatidylinositol, sphingomyelins and fatty acids (the latter are mainly present in bound form). The chain length of the fatty acids (regardless if being present in form of an isolated molecule or in form of fatty acid residues bound by an ester linkage to a lipid molecule) can generally differ. The same is true for the amount of double bonds being present in the fatty acids or fatty acid residues. In an embodiment, the first lipid component and/or the further lipid component is chosen from the group consisting of cholesterol, cholesterol esters, triglycerides, phosphatidylcholine, sphingomyelins and fatty acids. Thereby, fatty acids or fatty acid residues having a chain length of 10, 12, 14, 16, 18, 20 or 22, 24, 26 carbon atoms as well as 0, 1, 2, 3, 4, 5 or 6 double bonds is particularly suited. Particularly suited fatty acids are those having 16 carbon atoms and zero double bonds (16:0), 18 carbon atoms and zero double bonds (18:0), 18 carbon atoms and one double bond (18:1), and 18 carbon atoms and 2 double bonds (18:2).

In an embodiment, any of the spectral functions used for the fitting operations (i.e., the first spectral function of the first individual lipid component, the further spectral function of the further individual lipid component and/or the spectral functions of individual lipid components) are obtained on the basis of an NMR spectrum of the respective lipid component. Such NMR spectrum can be obtained by a measurement, e.g., in an organic solvent or by measuring lipid micelles in water or an aqueous medium. Thereby, the NMR signals of the measured lipid component should not be interfered with other NMR signals from different components. An interference with NMR signals of similar type (i.e., with NMR signals of different lipid components) would be acceptable. Thus, it is possible to measure different lipids such as a mixture of different phospholipids or a mixture of at least one phospholipid and at least one lipid at the same time and to still obtain a suited NMR spectrum of the respective lipid component, i.e. of the measured lipids or mixture of lipids.

Since the behavior of lipid component in pure form differs from the behavior of the same lipid component in the (inner) surroundings of the lipoprotein particle, the measured NMR spectrum (or a derivative thereof) has to be adjusted by mathematically shifting, broadening and/or adjusting its relative height such that the resulting function represents the NMR behavior of the respective lipid component in the surroundings of a lipoprotein particle of the lipoprotein class or lipoprotein subclass in question. While lipid components can be moved freely in their pure form, the movements are restricted in the surroundings of a lipoprotein particle. NMR signal alterations mainly occur due to different particle compositions, different particle sizes and different particle structure. These NMR alterations might encompass signal losses, signal broadenings and signal shifts. Instead of basing the spectral functions used for the fitting operations on measured NMR spectra, it also possible to rely on simulated spectra.

In the precedingly explained approach, the NMR spectrum of the lipid component in an organic solvent is transferred into an NMR spectrum in an aqueous medium by taking into account the diffusion behavior of the lipid component. Each lipid component shows the same diffusion behavior like the lipoprotein particle in which it is located. As already mentioned above, any of the spectral functions (i.e. the first spectral function of the first individual lipid component, the further spectral function of the further individual lipid component and/or the spectral functions of individual lipid components) extends over the whole spectral range to be analyzed. In an embodiment, any of the spectral functions comprises at least two NMR lines, in particular at least three NMR lines, in particular at least four NMR lines, in particular at least five NMR lines, in particular at least six NMR lines, in particular at least seven NMR lines, in particular at least eight NMR lines, in particular at least nine NMR lines, in particular at least ten NMR lines, in particular at least 20 NMR lines, in particular at least 50 NMR lines, in particular at least 100 NMR lines, in particular at least 200 NMR lines, in particular at least 300 NMR lines, in particular at least 400 NMR lines, in particular at least 500 NMR lines, in particular at least 600 NMR lines, in particular at least 700 NMR lines, in particular at least 800 NMR lines, in particular at least 900 NMR lines, in particular at least 1000 NMR lines. In an embodiment, the respective spectral function comprises 2 to 1000 lines or any other line range that can be built-up from the before-mentioned thresholds of NMR lines of the respective spectral function (e.g., 4 to 700 lines etc.).

In an embodiment, any of the spectral functions (i.e., the first spectral function of the first individual lipid component, the further spectral function of the further individual lipid component and/or the spectral functions of individual lipid components) serves for not only fitting a single NMR line of the NMR spectrum to be analyzed, but at least 2, in particular at least 3, in particular at least 4, in particular at least 5, in particular at least 6, in particular at least 7, in particular at least 8, in particular at least 9, and very particular at least 10 signals of the NMR spectrum of the lipoprotein-containing sample. The specific form of signals of the NMR spectrum of the lipoprotein-containing sample depends on the number of signals raised by the specific lipid component. Lipid components with a very homogeneous chemical structure have sharper NMR lines than more heterogeneously and complex formed lipid components.

In an embodiment, proper alignment of the first spectral function of the first individual lipid component, the further spectral function of the further individual lipid component, and/or the spectral functions of individual lipid components is achieved by aligning them on the basis of a defined diffusion behavior of a lipoprotein class or subclass.

BRIEF DESCRIPTION OF THE DRAWINGS

Aspects and details of the solution will be explained in more detail with respect to exemplary embodiments and accompanying Figures.

DESCRIPTION OF THE INVENTION

Figure 1A:
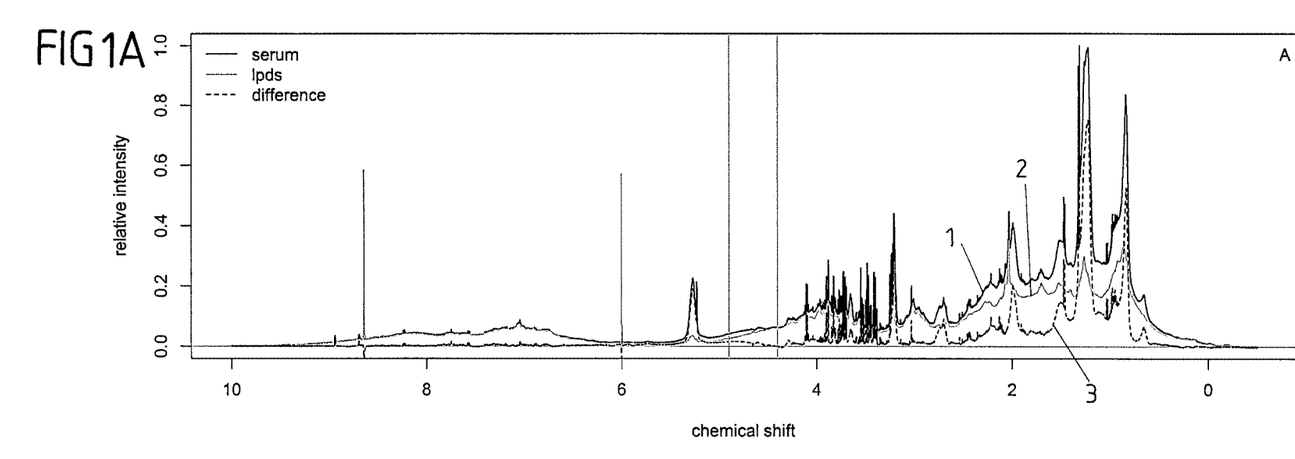
FIG. 1A shows a first set of standard $^1$H NMR spectra comprising an NMR spectrum of blood serum containing lipids.

FIG. 1A shows an NMR spectrum 1 of a blood serum sample (black line). To subtract all NMR signals originating from lipoprotein deficient serum (LPDS), an according LPDS NMR spectrum 2 has been recorded (grey line) and subtracted from the blood serum spectrum 1. The resulting difference spectrum 3 is also depicted in FIG. 1A (dashed line). In this resulting difference spectrum 3, only NMR signals not originating from components being present in lipoprotein deficient serum can be seen. These are essentially only lipoproteins and small metabolites. Thereby, FIG. 1A depicts standard $^1$H NMR spectra. In this and in all following Figures grey bars are depicted that indicate the spectral range in which signals can be observed that result from the solvent (water or organic solvent) in which the individual samples have been solved in order to record the respective NMR spectra.

Figure 1B:
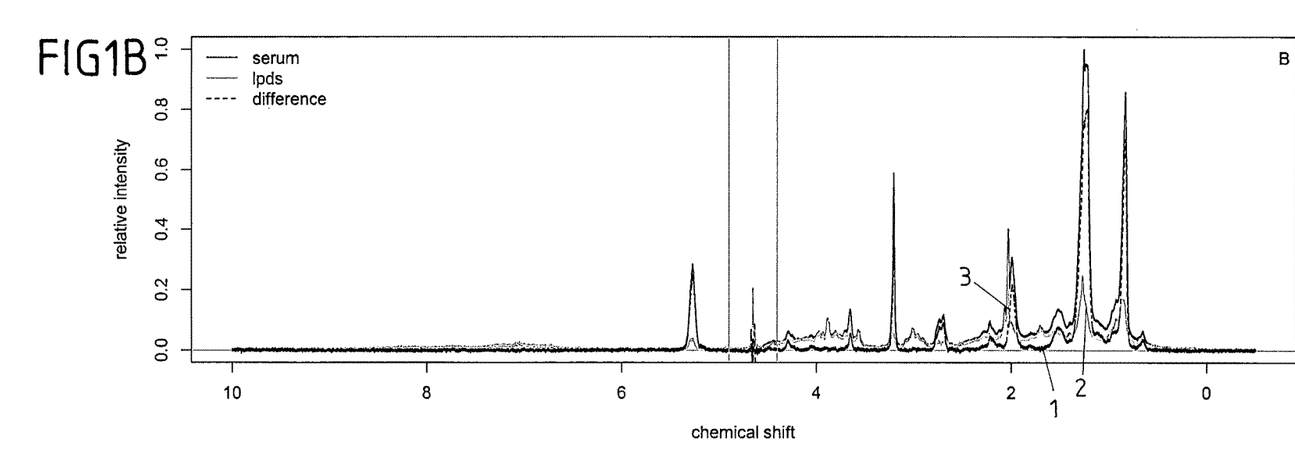
FIG. 1B shows a first set of diffusion-weighted NMR spectra of the same samples as in FIG. 1A.

FIG. 1B shows diffusion-weighted NMR spectra of the same samples as in FIG. 1A. Thus, any superposition with signals from metabolites are suppressed in the blood serum spectrum 1 (black line) and the LPDS spectrum 2 (grey line). Since metabolites usually diffuse quite quickly, their signals are efficiently suppressed in such diffusion spectra. This results in a better quality of the difference spectrum 3 (dashed line). If at all, metabolite signals occur in diffusion-weighted NMR spectra as very narrow lines and can be easily assigned to a specific substance by comparing the blood serum spectrum 1 with NMR spectra of different substances that regularly occur as metabolites in blood serum. Thereby, the metabolites are to be recorded in an environment being closely similar to blood serum to allow for an accurate assignment of the respective NMR lines in the blood serum spectrum 1. It is also possible to directly add the metabolites to blood serum.

Regarding the resulting difference spectrum 3 being mainly made of NMR signals of lipoproteins, it should be noted that lipoproteins comprise particles of different size. In addition, the lipid and protein composition of the different lipoproteins within the lipoprotein particles may vary.

According to the solution and within the framework of the present exemplary embodiment, it is assumed that the signals of the proteins being located within the lipoproteins can be neglected since those proteins are either not tightly bound to a lipoprotein particle (and therewith belong to the blood serum proteins) or are otherwise such tightly bound to a lipoprotein particle that their mobility and thus the resulting NMR signal is strongly decreased. According signals can be seen between 6 and 8 ppm.

Consequently, the difference spectrum 3 can be used as starting spectrum for subsequent fit operations with individual NMR spectra of lipid components.

Figure 2A:
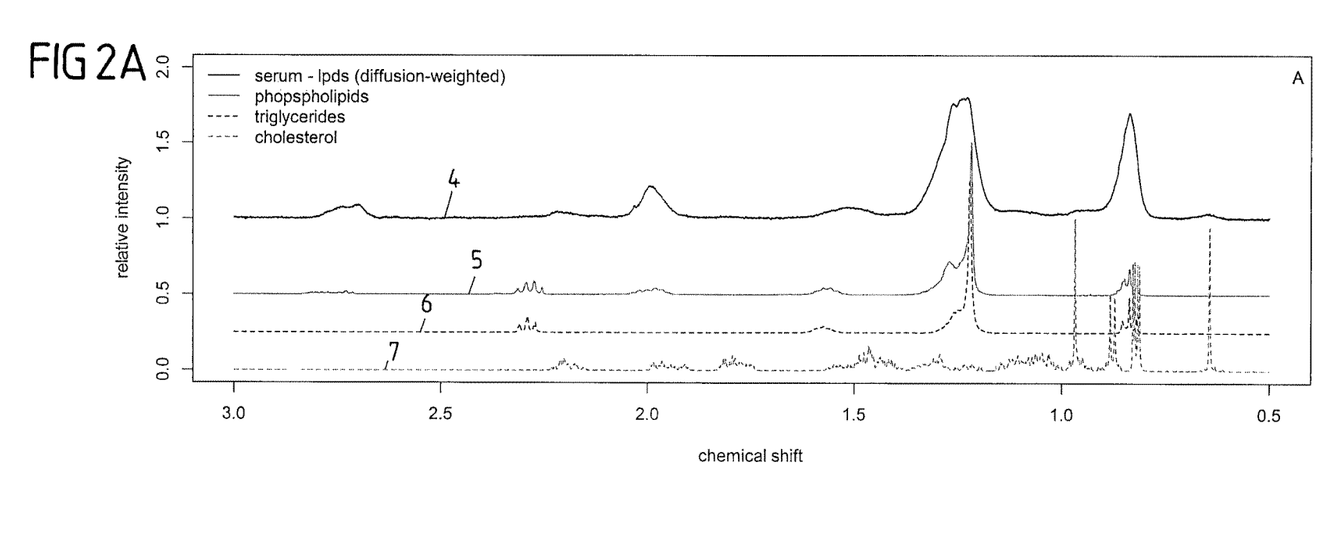
FIG. 2A shows a first detail of NMR spectra of blood serum and of individual lipid components.

FIG. 2A shows the chemical shift range from 0.5 ppm to 3.0 ppm of a difference spectrum 4 (continuous black curve) that has been obtained by subtracting NMR signals of lipid deficient serum from a diffusion-weighted 1H-NMR spectrum 4 of a blood serum sample. Thus, this difference spectrum 4 has been generated like the difference spectrum 3 of FIG. 1B. Furthermore, the NMR signals of different lipids that can be found in blood serum are shown in FIG. 2A, namely an 1H-NMR spectrum 5 of phospholipids (continuous grey curve), an 1H-NMR spectrum 6 of triglycerides (dashed black curve), and an 1H-NMR spectrum 7 of cholesterol (dashed grey curve). Thereby, FIG. 2A depicts in each case the chemical shift range from 0.5 ppm to 3.0 ppm of these spectra.

Figure 2B:
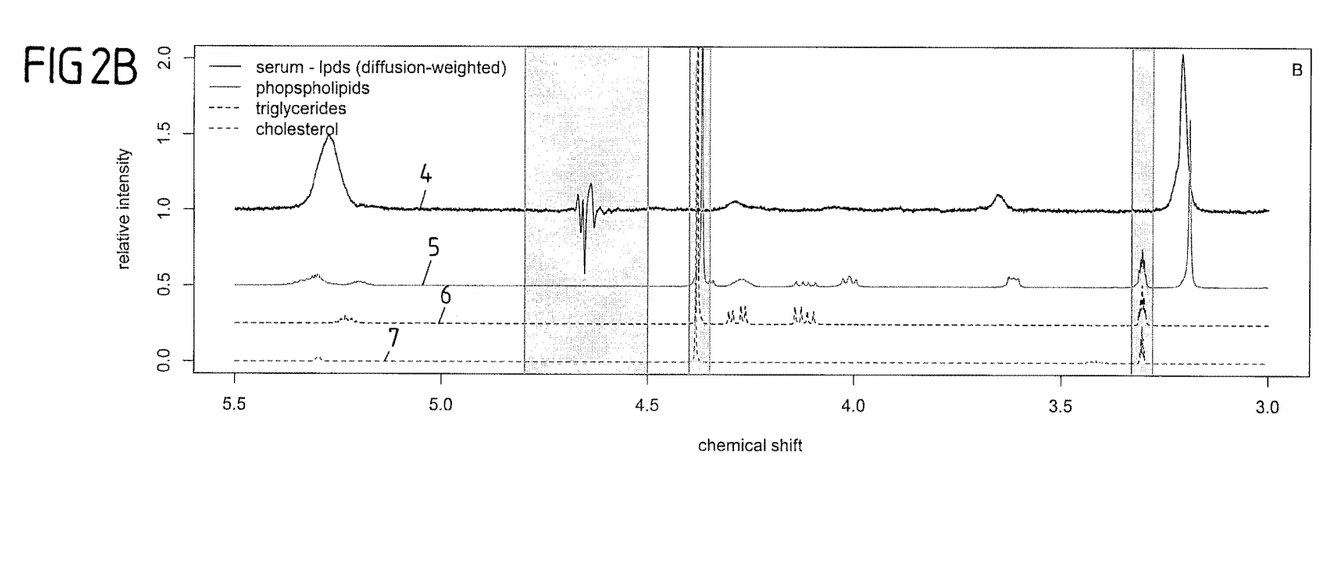
FIG. 2B shows a second detail of the same set of NMR spectra as shown in FIG. 2A.

FIG. 2B shows the same NMR spectra 4, 5, 6, 7 as FIG. 2A, but in a chemical shift range from 3.0 ppm to 5.5 ppm. The lipid spectra 5, 6, 7 of FIGS. 2A and 2B have been recorded in an organic solvent.

The NMR spectra 5, 6, 7 serve as basis for defining functions representing these spectra or at least a part of them. It is, e.g., possible that an individual NMR signal like the signal at ca. 1.6 ppm of the phospholipid NMR spectrum 5 is not considered when defining an according function. This signal is mainly caused by fatty acids. These fatty acids are present to a varying extent both in phospholipids as well as in triglycerides. To compensate for this varying extent, the NMR contribution of fatty acids is considered by a separate fit function, independent on whether the fatty acids are part of phospholipids or triglycerides. The according NMR spectrum of fatty acids is not shown in FIGS. 2A and 2B. Other NMR signals of the NMR spectrum 5 of phospholipids do not strongly differ for different phospholipids and are thus better suited to identify these class of lipids in NMR spectra.

To transfer the NMR spectra of the individual lipid components from an organic-solvent based reference system to an aqueous-medium based reference system, the diffusion behavior of different lipoprotein particles is taken into account. Every lipid component has to show the same diffusion behavior like a lipoprotein particle which is made of by this lipid component.

Figure 3:
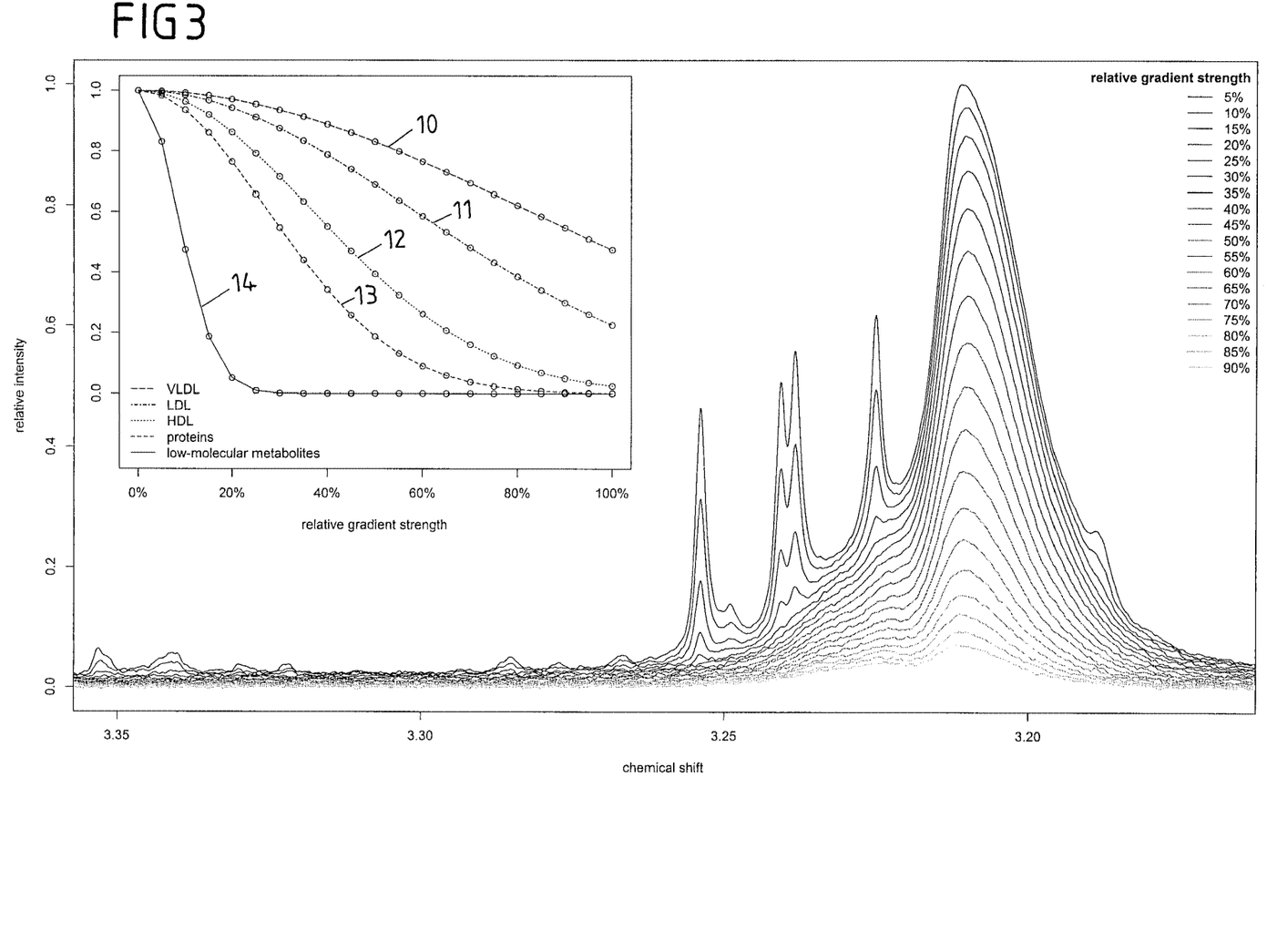
FIG. 3 shows the signal decay in diffusion-ordered NMR spectra in dependence on the gradient strength.

FIG. 3 illustrates the signal decay in diffusion-ordered NMR spectra and thus explains the different diffusion behaviors of different lipoprotein particles, of proteins, and of metabolites. Thereby, the relative intensity of a particular NMR signal is set into relation to the relative strength of the applied gradient strength. The resulting diffusion curve of VLDL (lipoprotein particles with very low density) 10, the resulting diffusion curve of LDL (lipoprotein particles having a low density) 11, the resulting diffusion curve of HDL (lipoprotein particles having a high density) 12, the resulting diffusion curve of proteins 13, and the resulting diffusion curves of low-molecular metabolites 14 indicate that the intensity of NMR signals decreases stronger a) with increasing density of the respective lipoprotein particles and b) with decreasing molecular weight of the respective component. The inventor could already show that the intensity of narrow NMR signals decreases faster with increasing gradient strength, whereas broad NMR signals show a significant lower signal loss by increasing gradient strength.

It is generally possible to perform further sub-divisions of VLDL, LDL and HDL into fractions of big, medium-sized and small VLDL, big, medium-sized and small LDL, as well as big, medium-sized and small HDL. Thus, the diffusion curves of VLDL 10, LDL 11, and HDL 12 are merely to be understood as an example of the influence of the gradient strength on different lipoprotein particles.

Figure 4:
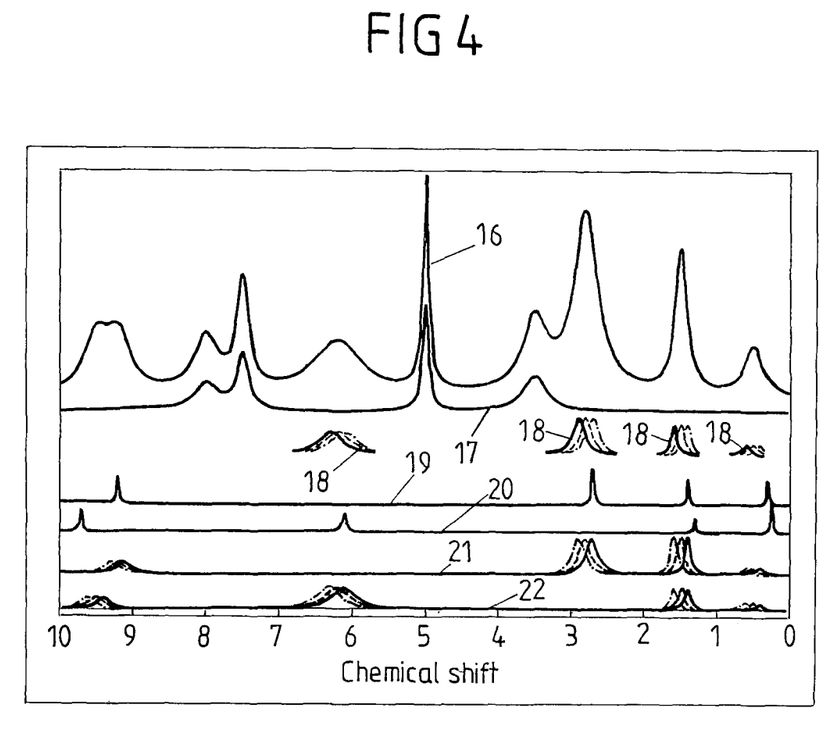
FIG. 4 shows different approaches for fitting an NMR spectrum.

FIG. 4 shows the different approaches of fitting NMR spectra according to prior art and according to the solution. Thereby, the topmost curve shows an NMR spectrum of a blood serum sample 16, and the second curve from the top shows an NMR spectrum accounting for protein signals 17 that can be easily subtracted from the NMR spectrum of the blood serum sample 16.

According to prior art techniques, fit functions representing individual NMR lines of different lipoprotein subclasses 18 have been used to fit individual lines of the NMR spectrum of the blood serum sample 16. Thereby, individual NMR lines of a first lipoprotein subclass 18 (dot-and-dashed curve), individual NMR lines of a second lipoprotein subclass 18 (dashed curve) and individual NMR lines of a third lipoprotein subclass 18 (continuous curve) have been used for fitting.

According to the presently described embodiment, the function of an NMR spectrum of a first individual lipid component 19 is used to fit the NMR spectrum of the blood serum sample 16. Thereby, the function representing the NMR spectrum of the first individual lipid component 19 describes the respective NMR spectrum over the whole spectral range in which NMR signals are observed. In the instant case as represented in FIG. 4 this spectral range extends from 0 ppm to 10 ppm. By not using individual functions describing individual lines of NMR spectra of a lipoprotein subclass 18, but by rather using the function describing the NMR spectrum of the first lipid component 19 over a whole spectral range or over specific cut-outs, a stable and well-conditioned fit can be achieved. Since lipoproteins contain more than one lipid, a function describing an NMR spectrum of a further lipid 20 (once again over the whole spectral range in which NMR lines are observed) is additionally used for performing a fit of the NMR spectrum of the blood serum sample 16.

As explained above, the NMR behavior of the individual lipids differs from their specific surrounding. This is accounted for by adjusting the function of the NMR spectrum of the first lipid 19 in different ways as indicated by the first adjusted functions of the first lipid 21. One function of the first adjusted functions 21 relates to the first lipid in a first lipoprotein subclass (dot-and-dashed curve). The second function of the first adjusted functions 21 relates to the first lipid in a second lipoprotein subclass (dashed curve). The third function of the first adjusted functions 21 relates to the first lipid in a third lipoprotein subclass (continuous curve).

The same adjustments are done with the function of the NMR spectrum of the second lipid 20. Therewith, second adjusted functions 22 result, wherein the first function of the second adjusted functions 22 relates to the second lipid in a first lipoprotein subclass (dot-and-dashed curve), the second function of the second adjusted functions 22 relates to the second lipid in a second lipoprotein subclass (dashed curve), and the third functions of the second adjusted functions 22 relates to the second lipid in a third lipoprotein subclass (continuous curve).

By applying the individual adjusted functions 21, 22 for a fit operation of the NMR spectrum of the blood serum sample 16 (optionally after having subtracted the NMR spectrum of protein components 17 from this NMR spectrum of the blood serum sample 16), a suited fit of this NMR spectrum of the blood serum sample 16 can be achieved.

The factors necessary to scale the individual adjusted functions 21, 22 to achieve a proper fit of a difference spectrum between serum spectrum 16 and protein spectrum 17 can then be used to calculate the concentration in which the lipid components (e.g., phospholipids, triglycerides, and cholesterol) are present in this difference spectrum.

The invention claimed is:

1. A method for analyzing an NMR spectrum of a lipoprotein-containing sample, comprising the following steps:
   a) defining a spectral range to be analyzed of at least 0.5 ppm of an NMR spectrum of a lipoprotein-containing sample,
   b) fitting a first spectral function of a first individual lipid component and at least one further spectral function of a further individual lipid component into the whole spectral range to be analyzed,
      wherein the first spectral function represents at least a part of an NMR spectrum of the first individual lipid component taking into account the behavior of the first lipid component in the surroundings of a lipoprotein particle of a first defined lipoprotein class or lipoprotein subclass, and
      wherein the further spectral function represents at least a part of an NMR spectrum of the further individual lipid component taking into account the behavior of the further lipid component in the surroundings of a lipoprotein particle of the same defined lipoprotein class or lipoprotein subclass, and
   c) determining a concentration or an amount of the first individual lipid component and the further individual lipid component and therefrom a concentration or an amount of the first defined lipoprotein class or lipoprotein subclass in the lipoprotein-containing sample and optionally of each other defined lipoprotein class or lipoprotein subclass based on the fitting operations of step b).

2. The method according to claim 1, wherein step b) is additionally performed with further spectral functions of individual lipid components, wherein each spectral function represents at least a part of an NMR spectrum of an individual lipid component taking into account the behavior of this lipid component in the surroundings of a lipoprotein particle of another defined lipoprotein class or lipoprotein subclass.

3. The method according to claim 2, wherein in step c) a concentration or an amount of the individual lipid components is determined and is used to determine a concentration or an amount of each other defined lipoprotein class or lipoprotein subclass.

4. The method according to claim 1, wherein the spectral range to be analyzed encompasses the whole spectral range measured in which spectral lines are observed.

5. The method according to claim 1, wherein the lipoprotein-containing sample is a blood serum or a blood plasma sample.

6. The method according to claim 1, wherein an NMR spectrum of compounds other than lipoproteins or lipids, or a function of such an NMR spectrum, is subtracted from the NMR spectrum of the lipoprotein-containing sample prior to the fitting operation.

7. The method according to claim 5, wherein an NMR spectrum of compounds other than lipoproteins or lipids, or a function of such an NMR spectrum, is subtracted from the NMR spectrum of the lipoprotein-containing sample prior to the fitting operation, and wherein the NMR spectrum to be subtracted is an NMR spectrum of lipoprotein deficient serum or another protein-depending spectrum or mixtures thereof.

8. The method according to claim 1, wherein at least one of the first lipid component and the further lipid component is chosen from the group consisting of cholesterol, cholesterol esters, triglycerides, phospholipids, sphingomyelins and fatty acids.

9. The method according to claim 1, wherein at least one of the first spectral function of the first individual lipid component, the further spectral function of the further individual lipid component, and the spectral functions of individual lipid components is obtained on the basis of an NMR spectrum of the respective individual lipid component, and wherein the lines of the NMR spectrum or a derivative of it are optionally shifted, broadened or adjusted in height to represent at least a part of an NMR spectrum of the respective lipid component in the surroundings of a lipoprotein particle.

10. The method according to claim 1, wherein at least one of the first spectral function of the first individual lipid component, the further spectral function of the further individual lipid component, and the spectral functions of individual lipid components comprises at least two lines.

11. The method according to claim 1, wherein at least one of the first spectral function of the first individual lipid component, the further spectral function of the further individual lipid component, and the spectral functions of individual lipid components serves for fitting more than one signal of the NMR spectrum of the lipoprotein-containing sample.

12. The method according to claim 1, wherein at least one of the first spectral function of the first individual lipid component, the further spectral function of the further individual lipid component, and the spectral functions of individual lipid components are aligned on the basis of a defined diffusion behavior of a lipoprotein class or lipoprotein subclass.

* * * * *